(12) United States Patent
Yokokawa et al.

(10) Patent No.: US 9,865,497 B2
(45) Date of Patent: Jan. 9, 2018

(54) METHOD FOR MANUFACTURING BONDED WAFER

(71) Applicant: SHIN-ETSU HANDOTAI CO., LTD., Tokyo (JP)

(72) Inventors: Isao Yokokawa, Takasaki (JP); Hiroji Aga, Takasaki (JP); Hiroshi Fujisawa, Ueda (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/916,289

(22) PCT Filed: Aug. 22, 2014

(86) PCT No.: PCT/JP2014/004329
§ 371 (c)(1),
(2) Date: Mar. 3, 2016

(87) PCT Pub. No.: WO2015/056386
PCT Pub. Date: Apr. 23, 2015

(65) Prior Publication Data
US 2016/0197008 A1 Jul. 7, 2016

(30) Foreign Application Priority Data

Oct. 17, 2013 (JP) .................................. 2013-216420

(51) Int. Cl.
*H01L 21/762* (2006.01)
*H01L 21/02* (2006.01)
*H01L 21/306* (2006.01)

(52) U.S. Cl.
CPC .. *H01L 21/76254* (2013.01); *H01L 21/02052* (2013.01); *H01L 21/02057* (2013.01); *H01L 21/30604* (2013.01)

(58) Field of Classification Search
CPC ......... H01L 21/02052; H01L 21/30604; H01L 21/02057; H01L 21/76254
See application file for complete search history.

(56) References Cited

U.S. PATENT DOCUMENTS 5,374,564 A 12/1994 Bruel
6,013,563 A * 1/2000 Henley ................. B81C 1/0038
257/E21.088

(Continued)

FOREIGN PATENT DOCUMENTS

CN 101689478 A 3/2010
JP H05-211128 A 8/1993

(Continued)

OTHER PUBLICATIONS

Dec. 2, 2014 International Search Report issued in International Patent Application No. PCT/JP2014/004329.

(Continued)

Primary Examiner — Savitr Mulpuri
(74) Attorney, Agent, or Firm — Oliff PLC

(57) ABSTRACT

A method for manufacturing bonded wafer including: producing bonded wafer having thin-film on its base wafer by an ion implantation delamination method, and reducing film thickness of the thin-film, wherein the step of reducing the film thickness includes a stage of reducing the film thickness by sacrificial oxidation treatment or vapor phase etching, wherein the method for manufacturing bonded wafer further includes a cleaning step of cleaning the bonded wafer exposing the delamination surface just before the step of reducing the film thickness, wherein the cleaning step includes a stage of performing a wet cleaning by successively dipping the bonded wafer to plural of cleaning baths, and wherein the wet cleaning is performed without applying ultrasonic in each of the cleaning baths in the wet cleaning. The method enables to clean bonded wafer exposing delami- (Continued)

nation surface remaining damage of ion implantation using a cleaning line in a strict control level.

6 Claims, 1 Drawing Sheet

(56) References Cited

U.S. PATENT DOCUMENTS

| | | | |
|---|---|---|---|
| 6,362,076 B1 | 3/2002 | Inazuki et al. | |
| 6,974,759 B2* | 12/2005 | Moriceau | H01L 21/76256 257/E21.568 |
| 7,718,509 B2* | 5/2010 | Endo | H01L 21/76256 438/113 |
| 7,855,128 B2* | 12/2010 | Zhu | H01L 21/76254 257/E21.568 |
| 8,097,523 B2* | 1/2012 | Kobayashi | H01L 21/76254 257/E21.568 |
| 8,173,521 B2* | 5/2012 | Kobayashi | H01L 21/02057 257/E21.212 |
| 8,268,705 B2* | 9/2012 | Yoshida | H01L 21/26506 257/E21.318 |
| 8,343,849 B2* | 1/2013 | Sasagawa | H01L 21/76254 257/E21.568 |
| 8,404,563 B2* | 3/2013 | Hanaoka | H01L 21/76254 257/E21.568 |
| 8,617,908 B2* | 12/2013 | Gaillard | B24B 37/013 257/E21.529 |
| 8,709,911 B2* | 4/2014 | Matsumine | H01L 21/2007 257/E21.567 |
| 8,728,912 B2* | 5/2014 | Aga | H01L 21/02381 257/E21.122 |
| 8,823,130 B2* | 9/2014 | Kato | H01L 21/02381 257/264 |
| 8,956,951 B2* | 2/2015 | Yokokawa | H01L 21/26506 257/E21.09 |
| 9,076,840 B2* | 7/2015 | Kobayashi | H01L 21/76254 |
| 2002/0026952 A1 | 3/2002 | Fujino et al. | |
| 2004/0237998 A1 | 12/2004 | Hall et al. | |
| 2004/0259328 A1* | 12/2004 | Ito | H01L 22/12 438/459 |
| 2004/0266191 A1 | 12/2004 | Schwab et al. | |
| 2006/0011214 A1 | 1/2006 | Liu et al. | |
| 2008/0078425 A1 | 4/2008 | Hashimoto | |
| 2010/0129993 A1 | 5/2010 | Yokokawa et al. | |
| 2013/0312787 A1 | 11/2013 | Suzuki | |
| 2016/0193631 A1 | 7/2016 | Shimazaki et al. | |

FOREIGN PATENT DOCUMENTS

| | | |
|---|---|---|
| JP | H11-307472 A | 11/1999 |
| JP | H11-307498 A | 11/1999 |
| JP | 2005-019999 A | 1/2005 |
| JP | 2009-027124 A | 2/2009 |
| JP | 2012-151320 A | 8/2012 |
| JP | 2013-021160 A | 1/2013 |
| JP | 2013-084663 A | 5/2013 |
| TW | 1243418 B | 6/2003 |
| TW | 201113103 A | 4/2011 |

OTHER PUBLICATIONS

Apr. 19, 2016 International Preliminary Report on Patentability issued in International Patent Application No. PCT/JP2014/004329.
Aug. 9, 2016 Office Action issued in Taiwanese Patent Application No. 103132638.
Oct. 18, 2016 Office Action issued in Japanese Patent Application No. 2013-216420.
Jun. 28, 2017 Office Action and Search Report issued in Chinese Patent Application No. 201480049853.2.
Feb. 24, 2017 Search Report issued in European Patent Application No. 14854103.0.

* cited by examiner

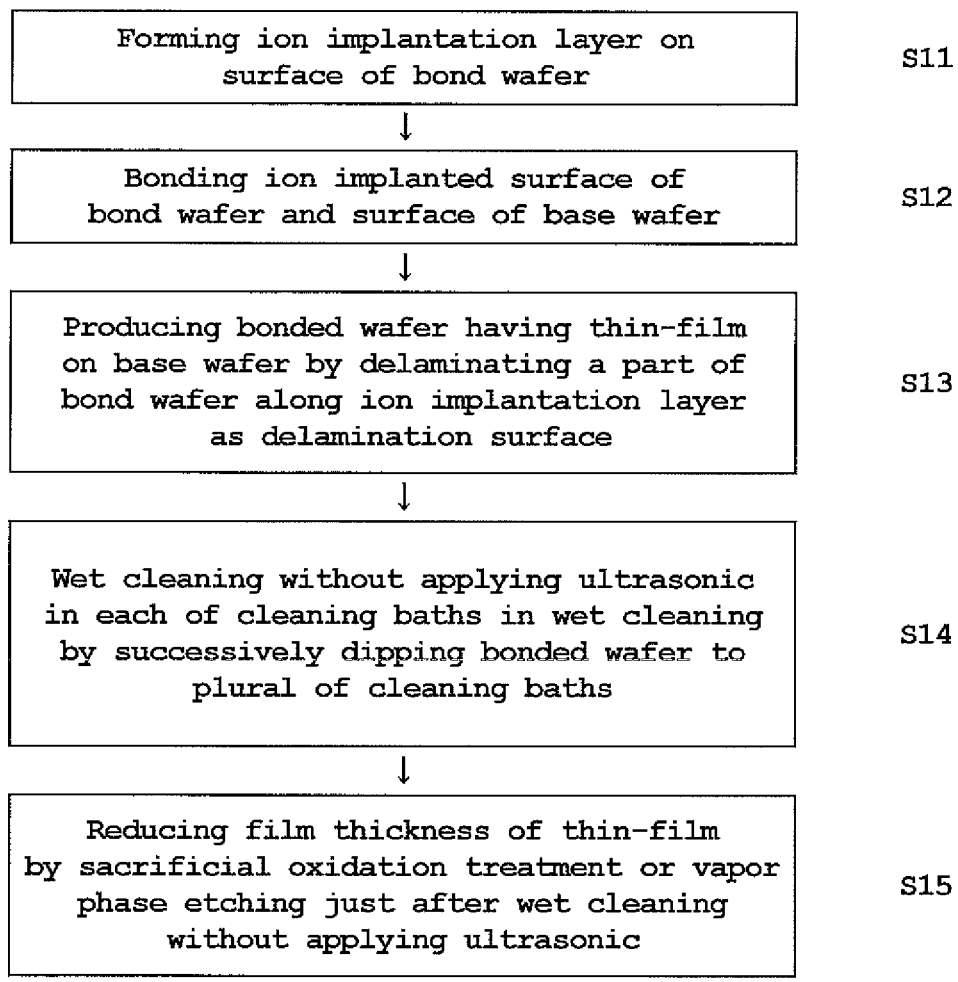

METHOD FOR MANUFACTURING BONDED WAFER

BACKGROUND OF THE INVENTION

1. Field of the Invention

The present invention relates to a method for manufacturing a bonded wafer by an ion implantation delamination method.

2. Description of the Related Art

A method of manufacturing a SOI wafer by delaminating ions-implanted wafers after bonding, i.e., an ion implantation delamination method (a technique also referred to as the Smart Cut method (registered trademark)), has attracted attention as a method of manufacturing silicon on insulator (SOI) wafers, particularly a method of manufacturing SOI wafers having a thin SOI layer that enable improvement in performance of advanced integrated circuits.

This ion implantation delamination method is a technique to form an SOI wafer (See Patent Literature 1) in the following manner: an oxide film is formed on at least one of two silicon wafers; gas ions such as hydrogen ions or rare gas ions are implanted from a front surface of one of the silicon wafers (a bond wafer) to form the ion implantation layer (also referred to as a micro bubble layer or an enclosed layer) in the interior of the wafer; the surface from which the ions are implanted is then brought into close contact with the other silicon wafer (a base wafer) through the oxide film; a heat treatment (a delamination heat treatment) is then performed to cleave one of the wafers (the bond wafer) along the micro bubble layer so that the bond wafer is separated into a thin film; and another heat treatment (a bonding heat treatment) is then performed to strengthen a bond between the wafers. At this point, the cleavage plane (the delamination surface) is a surface of an SOI layer, and an SOI wafer having a thin SOI with high uniformity is relatively easily obtained.

The surface of the delaminated SOI wafer, however, contains a damaged layer due to ion implantation, and has surface roughness larger than the mirror surface of the usual silicon wafer. Accordingly, it is necessary to remove such damaged layer and surface roughness in an ion implantation delamination method.

Conventionally, mirror polishing with extremely small polishing stock removal (a stock removal of about 100 nm), referred to as touch polishing, has been performed in order to remove the damaged layer and the like in the final step after the bonding heat treatment. However, when polishing including a mechanical processing element is performed with respect to the SOI layer, since the stock removal of the polishing is not uniform, there occurs a problem that film thickness uniformity of the SOI layer achieved by implantation of hydrogen ions etc. and delamination is deteriorated.

For the purpose of solving such a problem, a flattening process involving heat treatment at a high temperature has been performed to improve the surface roughness instead of the touch polishing.

For example, Patent Literature 2 proposes to add a heat treatment (a rapid heating/rapid cooling heat treatment (an RTA treatment)) in a reducing atmosphere containing hydrogen without polishing a surface of an SOI layer after a delamination heat treatment (or a bonding heat treatment).

Herein, it is necessary to perform wet cleaning which is well-known and is called RCA cleaning prior to the heat treatment for the surface of the delaminated SOI layer (the delaminated layer) in order to avoid contamination such as particles or impurities as described in paragraph [0065] of Patent Literature 2.

Further, in paragraph [0050] of Patent Literature 3, the following subject matter is described: when manufacturing a SOI wafer having an oxide film on a terrace part (the peripheral part of a wafer where base wafer is exposed) by an ion implantation delamination method, silicon flakes will adhere onto an oxide film of a terrace part at the time that a bond wafer is delaminated and this causes particle contamination, etc. through the subsequent epitaxial growth. In order to avoid that, wet cleaning such as SC1 cleaning or HF cleaning are performed as a cleaning step to remove silicon flakes on the terrace part prior to an epitaxial growth.

Incidentally, wet cleaning described in Patent Literatures 2 and 3 commonly uses a cleaning method with applying ultrasonic to cleaning fluid to remove particle contaminants from an object to be cleaned by the vibrating action (ultrasonic cleaning) (see Patent Literatures 4 and 5).

CITATION LIST

Patent Literature

Patent Literature 1: Japanese Unexamined Patent publication (Kokai) No. H05-211128
Patent Literature 2: Japanese Unexamined Patent publication (Kokai) No. H11-307472
Patent Literature 3: Japanese Unexamined Patent publication (Kokai) No. 2009-027124
Patent Literature 4: Japanese Unexamined Patent publication (Kokai) No. 2013-021160
Patent Literature 5: Japanese Unexamined Patent publication (Kokai) No. 2012-151320

SUMMARY OF THE INVENTION

As described above, in manufacturing a bonded wafer by an ion implantation delamination method, it is necessary to perform a heat treatment to improve the bonding strength (a bonding heat treatment) as a step just after the delamination, since a bonded wafer just after the delamination lacks sufficient bonding strength on the bonding interface. Just before such heat treatment with use of a heat treatment furnace, it is indispensable to perform wet cleaning, the so-called RCA cleaning in order to avoid contamination of the heat treatment furnace which results from particles or impurities and the like.

As described in Patent Document 3, it is known that particles such as silicon flakes adhere to a terrace part of a bonded wafer just after the delamination. Therefore, in order to remove them effectively, cleaning is performed with applying ultrasonic, which has remarkable effect to remove particles, to cleaning baths in wet cleaning prior to an epitaxial growth. This enables to remove a particle source such as silicon flakes effectively, and to proceed a manufacturing step without affecting post-process.

However, the present inventors have investigated to found that cleaning with applying ultrasonic removes originally adhered relatively large particles (90 nm or more) such as silicon flakes just after the delamination, but it newly generates relatively small particles (about 65 nm) from the delamination surface remaining damage of an ion implantation.

Generally, cleaning of bath is performed when the particle level in a cleaning fluid in the cleaning bath has exceeded a prescribed control value or after a certain amount of treatment has been performed. The cleaning of bath is performed by overflowing the cleaning bath with pure water.

However, the present inventors have investigated to found that particles with sizes of about 65 nm are difficult to remove from a cleaning bath by an overflow, and are difficult to decrease, once contamination generated, and thereby cleaning of bath requires extremely long time, and as a result, there arises a problem to deteriorate the productivity of a cleaning line.

Furthermore, the same problem arises in cleaning just before the flattening process of a delamination surface by sacrificial oxidation or vapor phase etching performed after a delamination heat treatment.

The present invention was accomplished in view of the above-described problems. It is an object of the present invention to provide a method for manufacturing a bonded wafer which enables to clean the bonded wafer by a cleaning line which detects and controls the particles with sizes of 65 nm or more by preventing a generation of particles with sizes of about 65 nm from the delamination surface in a cleaning step of a bonded wafer exposing a delamination surface remaining damage of ion implantation.

To achieve this object, the present invention provides a method for manufacturing a bonded wafer comprising: forming an ion implantation layer by ion implanting at least one gas ion selected from a hydrogen ion and a rare gas ion from a surface of a bond wafer; bonding the ion implanted surface of the bond wafer and a surface of a base wafer directly or through an insulating film; producing a bonded wafer having a thin-film on the base wafer by delaminating a part of the bond wafer along the ion implantation layer as a delamination surface; and reducing a film thickness of the thin-film, wherein the step of reducing the film thickness comprises a stage of reducing the film thickness by sacrificial oxidation treatment or vapor phase etching, wherein the method for manufacturing a bonded wafer further comprises a first cleaning step of cleaning the bonded wafer exposing the delamination surface just before the step of reducing the film thickness, wherein the first cleaning step includes a stage of performing wet cleaning by successively dipping the bonded wafer to plural of cleaning baths, and wherein the wet cleaning is performed without applying ultrasonic in each of the cleaning baths in the wet cleaning.

In a cleaning step of a bonded wafer exposing a delamination surface remaining damage of ion implantation, cleaning just before the step of reducing the film thickness enables to prevent a generation of particles with sizes of about 65 nm from the delamination surface by cleaning without applying ultrasonic in each of the cleaning baths as described above, and as a result, enables to clean the bonded wafer by a cleaning line which detects and controls the particles with sizes of 65 nm or more. Moreover, when the thin-film is subsequently subjected to a flattening process by reducing the film thickness by sacrificial oxidation treatment or vapor phase etching without interposing other steps, it is possible to remove the damage-remaining part on a delamination surface, which is a generating source of particles with sizes of about 65 nm, and therefore it is possible to suppress the generation of particles in the post-process.

In this case, it is possible to contain a second cleaning step of performing wet cleaning with applying ultrasonic before the first cleaning step.

By interposing the second cleaning step of performing wet cleaning with applying ultrasonic before the first cleaning step of performing wet cleaning without applying ultrasonic as described above, it is possible to suppress insufficient removal of particles with relatively large size of 90 nm or more such as silicon flakes adhering onto a terrace part of a bonded wafer just after the delamination.

Furthermore, it is possible to contain a third cleaning step of performing cleaning by a physical action before the first cleaning step.

By interposing the third cleaning step of performing cleaning by a physical action before the first cleaning step without applying ultrasonic as described above, it is possible to suppress an insufficient removal of particles with relatively large size of 90 nm or more such as silicon flakes adhering onto a terrace part of a bonded wafer just after the delamination.

In this case, it is possible to use a silicon single crystal wafer as the bond wafer and the base wafer, to use a silicon oxide film as the insulating film, and to provide the thin-film as a SOI layer.

As described above, the above material can be used suitably as a bond wafer, a base wafer, an insulating film, and a thin-film.

As described above, in a cleaning step of a bonded wafer exposing a delamination surface remaining damage of ion implantation, cleaning just before the step of reducing the film thickness accordance with the present invention enables to prevent a generation of particles with sizes of about 65 nm from the delamination surface by cleaning without applying ultrasonic in each of the cleaning baths, and enables to clean a bonded wafer by a cleaning line which detects and controls the particles with sizes of 65 nm or more.

BRIEF DESCRIPTION OF DRAWINGS

FIG. 1 is a flowchart showing an example of the method for manufacturing a bonded wafer of the present invention.

DETAILED DESCRIPTION OF THE PREFERRED EMBODIMENTS

The present invention will be explained specifically with referring the FIGURE as an embodiment in the following, but the present invention is not limited thereto.

In cleaning a wafer represented by a silicon single crystal wafer, not only a bonded wafer relating to the present invention, it is one of important subjects to sufficiently remove particles adhering onto a wafer. In order to remove the particles sufficiently, usually, ultrasonic is applied to at least one bath of a cleaning bath or rinsing bath of a cleaning line to improve particle removing effect.

Generally, cleaning treatments in a cleaning line are performed about thirty batches per one time. However, it depends on a control level of contamination of a cleaning line, changing amount of a composition of a reagent solution (changing due to evaporation, etc.), and contamination level of a product to be cleaned. This is because particles and contaminants removed from a wafer are accumulated in a cleaning bath during cleaning. In order to remove the particles and contaminants, which are accumulated in a cleaning bath, from the cleaning bath, the cleaning of bath (bath cleaning) is carried out every prescribed batches of the treatment.

The control of the particle level of a cleaning line is carried out by cleaning a monitor wafer at either or both of the beginning of cleaning and after the end of cleaning and by evaluating particles adhered onto it. The evaluation at the beginning of cleaning is carried out in order to confirm whether contaminants remains in the cleaning bath or not; and the evaluation after the end of cleaning is carried out in order to confirm whether the cleaning bath is contaminated or not until the cleaning is over.

As the particle size to be detected for counting the number of particles, although the above size depends on a quality level required to the cleaning line, previously, particles with sizes of 90 nm or more were mostly used to be detected and controlled conventionally.

When cleaning a bonded wafer exposing the delamination surface with use of a cleaning line which is controlled by detecting particles with sizes of 90 nm or more, there is not a problem that extremely long time is required for bath cleaning compared to the case in cleaning of a general mirror-polished silicon single crystal wafer.

Recently, however, as the control level of particles comes to be stricter and comes to be controlled by detecting particles with sizes of 65 nm or more, it was found that extremely long time is required for the bath cleaning after cleaning a bonded wafer exposing the delamination surface, and a problem that the productivity of the cleaning line is lowered, arises.

The present inventors have investigated in detail this reason to find that particles with sizes of about 65 nm newly peel off from the delamination surface and enormously float in the cleaning bath by applying ultrasonic, and the above particles are difficult to be removed from the cleaning bath by an overflow in bath cleaning, and this causes the reason for difficulty to decrease contamination, once it is generated.

On the other hand, when cleaning by using the same condition without applying ultrasonic, it is rare that particles with sizes of about 65 nm peel off newly from a delamination surface and float in a cleaning bath. The present inventors have confirmed the above fact, and thereby bringing the present invention to completion.

The method for manufacturing a bonded wafer of the present invention will be explained hereinafter with referring to FIG. 1.

First, an ion implantation layer is formed onto the surface of a bond wafer (see step S11 in FIG. 1).

Specifically, an ion implantation layer is formed on a bond wafer by ion implanting at least one gas ion selected from a hydrogen ion and a rare gas ion from a surface of a bond wafer.

Then, the ion implanted surface of the bond wafer and a surface of a base wafer are bonded (see step S12 in FIG. 1).

Specifically, the ion implanted surface of the bond wafer and a surface of a base wafer are bonded directly or through an insulating film.

Herein, the bond wafer and the base wafer to be prepared can be a silicon single crystal wafer, but an insulating substrate such as a quarts substrate can be used as a base wafer.

Incidentally, when bonding through an insulating film, it is possible to growth the insulating film (such as an oxide film) which will be a buried oxide film layer on the bond wafer by thermal oxidation or CVD, for example. Of course, the insulating film can be formed on a base wafer.

Then, a bonded wafer having a thin-film on the base wafer is manufactured by delaminating a part of the bond wafer along the ion implantation layer as a delamination surface (see step S13 in FIG. 1).

Specifically, a bonded wafer is subjected to a heat treatment for forming a micro bubble layer in the ion implantation layer in a bond wafer (a delaminating heat treatment) and then delaminated along the micro bubble layer to produce a bonded wafer having a thin-film on the base wafer.

Herein, when a silicon single crystal wafer is used as a bond wafer, a silicon oxide film can be used as an insulating film, and the formed thin-film can be provided as a SOI layer.

Then, the first wet cleaning is performed, in which a bonded wafer is successively dipped to a plural of cleaning baths. In this case, the wet cleaning is performed without applying ultrasonic in each of the cleaning baths (see step S14 in FIG. 1).

As described above, in a cleaning step of a bonded wafer exposing a delamination surface remaining damage of ion implantation, cleaning just before the step of reducing the film thickness enables to prevent a generation of particles with sizes of about 65 nm from the delamination surface by cleaning without applying ultrasonic in each of the cleaning baths, and enables to clean a bonded wafer by a cleaning line which detects and control the particles with sizes of 65 nm or more. Furthermore, by performing flattening of the thin-film by sacrificial oxidation treatment or vapor phase etching, which is a post-process of the above cleaning, without imposing another step after the cleaned wafer is dried, it is possible to remove the damage-remaining part of the delamination surface, which is a generating source of particles with sizes of about 65 nm, and it is possible to suppress the generation of particles in post-process.

It is also possible to perform a wet cleaning step with applying ultrasonic (the second cleaning step) before the wet cleaning step without applying ultrasonic of step S14 (the first cleaning step).

By interposing the second cleaning step of performing a wet cleaning with applying ultrasonic before the first cleaning step of performing a wet cleaning without applying ultrasonic, it is possible to suppress insufficient removal of particles with relatively large size of 90 nm or more such as silicon flakes adhering onto a terrace part of a bonded wafer just after the delamination.

Furthermore, it is possible to perform a wet cleaning step of performing cleaning by a physical action (the third cleaning step) before the wet cleaning step without applying ultrasonic of step S14 (the first cleaning step).

Herein, performing cleaning by a physical action means to perform cleaning by rubbing a wafer surface with use of a sponge such as scrub cleaning.

By interposing the third cleaning step of performing cleaning by a physical action before the first cleaning step of performing wet cleaning without applying ultrasonic, it is possible to suppress insufficient removal of particles with relatively large size of 90 nm or more such as silicon flakes adhering onto a terrace part of a bonded wafer just after the delamination.

It is preferable that the cleaning line to perform wet cleaning with applying ultrasonic or cleaning by a physical action is provided separately from the cleaning line to perform wet cleaning without applying ultrasonic and is used as a cleaning line with lower control level (for example, a cleaning line which is controlled by a particle level of 90 nm or more).

Thereby, the cleaning line to perform wet cleaning without applying ultrasonic (i.e., the cleaning line used for the first cleaning step of the present invention), can be kept as a cleaning line with high control level, and therefore this cleaning line can be shared as a cleaning line (which is used with applying ultrasonic) for a wafer other than the present invention (a wafer in which strict particle level is required), thereby the cleaning line can be used efficiently.

Herein, the wet cleaning performed in the present invention is not particularly limited, and any commonly performed methods can be applied. It is possible to use pure water cleaning, acid cleaning, alkaline cleaning, cleaning by organic solvent and the like, as well as so called RCA cleaning, SC-1, and SC-2 in accordance with the purpose.

Then, reducing a film thickness of the thin-film is performed by sacrificial oxidation treatment or vapor phase etching just after the wet cleaning without applying ultrasonic (see step S15 in FIG. 1).

Herein, sacrificial oxidation treatment means a treatment in which a thermal oxidation is performed and then the oxide film formed by the thermal oxidation is etched to be removed.

Also, vapor phase etching means, for example, a method for etching the surface of a wafer by heat treatment in an atmosphere containing HCl gas or $H_2$ gas, or a method of making the wafer thickness to be uniform by partial etching of the surface of a wafer with use of plasma, and so on.

When the thin-film is flattened through reducing the film thickness by sacrificial oxidation treatment or vapor phase etching without interposing another step after the wet cleaning step without applying ultrasonic of step S14 (the first cleaning step), it is possible to remove the damage-remaining part of the delamination surface, which is a generating source of particles with sizes of about 65 nm, and thereby it is possible to suppress the generation of particles in post-process.

EXAMPLES

The present invention will be more specifically described below with reference to experimental examples, examples, and comparative examples, but the present invention is not limited to these examples.

Experimental Examples

In accordance with the flow shown in FIG. 1, bonded SOI wafers were produced.

The producing conditions of the bonded SOI wafers were as follows:
  wafer to be used: a single crystal silicon wafer with crystal orientation of <100> having a diameter of 200 mm
  oxide film on a bond wafer: thermal oxidized film of 150 nm (an oxide film was not formed on the base wafer)
  implantation condition of hydrogen ion: implantation energy of 60 keV, dose of $7\times10^{16}/cm^2$
  delamination heat treatment: 500° C., 30 min, Ar atmosphere The bonded SOI wafers produced by the above condition were subjected to post-delamination cleaning with use of the cleaning line having the following cleaning sequence:
  cleaning sequence: SC-1→Rinse 1→Rinse 2→SC-2→Rinse 3→Rinse 4
    SC-1: $NH_4OH/H_2O_2$ aqueous solution, 75° C., without applying ultrasonic, 4 min
    SC-2: $HCl/H_2O_2$ aqueous solution, 80° C., without applying ultrasonic, 4 min
    Rinse 1 and Rinse 3: with applying ultrasonic/without applying ultrasonic, 4 min
      the condition of applying ultrasonic 750 kHz, 3 min
    Rinse 2 and Rinse 4: without applying ultrasonic, 4 min
    Regarding each of the levels with or without applying ultrasonic, cleaning of bath were performed by the following conditions after processing 25 wafers×30 batches
    condition of cleaning of bath: an overflow (20 L/min, 3 min).

Regarding each of the levels of with or without applying ultrasonic, a monitor wafer (a mirror polished silicon single crystal wafer) was dipped into a Rinse 1 bath and a Rinse 3 bath, which had been cleaned, and after vacuum drying, a number of the particle with a size of 65 nm or more on the monitor wafer was measured.

Incidentally, the measuring of a number of the particle was carried out with use of SP1 made by KLA-Tencor corporation.

The results are shown in Table 1.

TABLE 1

|  | number of particles of Rinse 1 bath | number of particles of Rinse 3 bath |
| --- | --- | --- |
| with applying ultrasonic | 62 particles/wafer | 83 particles/wafer |
| without applying ultrasonic | 3 particles/wafer | 3 particles/wafer |

As can be seen from Table 1, each of the numbers of particles of the Rinse 1 bath and the Rinse 3 bath in the level without applying ultrasonic were within a control level (≤5 particles/wafer). On the other hand, each of the numbers of particles of the Rinse 1 bath and the Rinse 3 bath in the level with applying ultrasonic greatly exceeded the above control level.

It required still more overflow for 24 hours in order to set the numbers of particles of the Rinse 1 bath and the Rinse 3 bath which were performed with applying ultrasonic into the above control level.

Example

In accordance with the flow shown in FIG. 1, 300 bonded SOI wafers were produced.

The producing conditions of the bonded SOI wafers were as follows:
  wafer to be used: a single crystal silicon wafer with crystal orientation of <100> having a diameter of 200 mm
  oxide film on a bond wafer: thermal oxidized film of 150 nm (an oxide film was not formed on the base wafer)
  implantation condition of hydrogen ion: implantation energy of 60 keV, dose of $7\times10^{16}/cm^2$
  delamination heat treatment: 500° C., 30 min, Ar atmosphere
  post-delamination cleaning:
    cleaning sequence: SC-1→Rinse 1→Rinse 2→SC-2→Rinse 3→Rinse 4
    SC-1: $NH_4OH/H_2O_2$ aqueous solution, 75° C., without applying ultrasonic, 4 min
    SC-2: $HCl/H_2O_2$ aqueous solution, 80° C., without applying ultrasonic, 4 min
    Rinse 1 to Rinse 4: without applying ultrasonic, 4 min
  process for reducing a film thickness:
    sacrificial oxidation: 900° C., pyrogenic oxidation (an oxide film of 200 nm)
    remover of a sacrificial oxidation film: 15% aqueous HF solution In the cleaning line, regarding 300 wafers in which the delamination process was preformed, post-delamination cleaning (the first cleaning step of the present invention) were performed, and subsequently, cleaning of bath in the cleaning line (by the same condition with Experimental example) was performed. Then, this cleaning line was used for a cleaning line to perform cleaning of 100 mirror-polished silicon single crystal wafers by applying ultrasonic to the Rinse 1 bath and the Rinse 3 bath.

Each of the numbers of particles with sizes of 65 nm or more on the silicon single crystal wafers after the cleaning were 3 particles/wafer or less, which were within the control level (≤5 particles/wafer).

Comparative Example

The production of bonded SOI wafers and cleaning of mirror-polished silicon single crystal wafers were carried out by the same condition with Examples except that ultrasonic was applied to the Rinse 1 bath and the Rinse 3 bath in the post-delamination cleaning.

Each of the numbers of particles with sizes of 65 nm or more on the silicon single crystal wafers after the cleaning were 50 particles/wafer or more, which were greatly exceeded the above control level. Therefore, it was found that the problem of micro particles arises if the cleaning line would be shared.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded wafer comprising:
    forming an ion implantation layer by ion implanting at least one gas ion selected from a hydrogen ion and a rare gas ion from a surface of a bond wafer;
    bonding the ion implanted surface of the bond wafer and a surface of a base wafer directly or through an insulating film;
    producing a bonded wafer having a thin-film on the base wafer by delaminating a part of the bond wafer along the ion implantation layer as a delamination surface;
    cleaning the bonded wafer exposing the delamination surface in a first cleaning step; and
    reducing a film thickness of the thin-film directly after the first cleaning step,
    wherein the step of reducing the film thickness comprises a stage of reducing the film thickness by sacrificial oxidation treatment or vapor phase etching,
    wherein the first cleaning step includes a stage of performing a wet cleaning by successively dipping the bonded wafer to plural of cleaning baths,
    wherein the wet cleaning is performed without applying ultrasonic in each of the cleaning baths in the wet cleaning,
    wherein the first cleaning step is performed with using a cleaning line which detects and controls the particles with sizes of 65 nm or more and, wherein a generation of particles with sizes of at least 65 nm from the delamination surface is prevented by performing the wet cleaning without applying ultrasonic in each of the cleaning baths.

2. The method for manufacturing a bonded wafer according to claim 1, further comprising a second cleaning step of performing a wet cleaning with applying ultrasonic before the first cleaning step.

3. The method for manufacturing a bonded wafer according to claim 1, further comprising a third cleaning step of performing a cleaning by a physical action before the first cleaning step.

4. The method for manufacturing a bonded wafer according to claim 1, wherein a silicon single crystal wafer is used as the bond wafer and the base wafer, a silicon oxide film is used as the insulating film, and the thin-film is provided as a SOI layer.

5. The method for manufacturing a bonded wafer according to claim 2, wherein a silicon single crystal wafer is used as the bond wafer and the base wafer, a silicon oxide film is used as the insulating film, and the thin-film is provided as a SOI layer.

6. The method for manufacturing a bonded wafer according to claim 3, wherein a silicon single crystal wafer is used as the bond wafer and the base wafer, a silicon oxide film is used as the insulating film, and the thin-film is provided as a SOI layer.

* * * * *